(12) United States Patent
Wang et al.

(10) Patent No.: US 12,199,621 B2
(45) Date of Patent: Jan. 14, 2025

(54) SYSTEMS AND METHODS FOR IMPROVED CHARGE PUMP PHASE-LOCKED LOOP PHASE STABILITY

(71) Applicant: Apple Inc., Cupertino, CA (US)

(72) Inventors: Hongrui Wang, San Jose, CA (US); Abbas Komijani, Mountain View, CA (US); Hideya Oshima, Santa Clara, CA (US); Reetika K Agarwal, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/135,343

(22) Filed: Apr. 17, 2023

(65) Prior Publication Data

US 2024/0348254 A1    Oct. 17, 2024

(51) Int. Cl.
*H03L 7/089* (2006.01)
*H02M 3/07* (2006.01)

(52) U.S. Cl.
CPC ............ *H03L 7/0893* (2013.01); *H02M 3/07* (2013.01)

(58) Field of Classification Search
CPC .................................................. H03L 7/0893
USPC ...................................................... 327/157
See application file for complete search history.

(56) References Cited

U.S. PATENT DOCUMENTS

| | | | |
|---|---|---|---|
| 6,415,007 B1 | 7/2002 | Kawasumi | |
| 7,868,808 B2 | 1/2011 | Caplan | |
| 8,022,739 B2 | 9/2011 | Yan | |
| 8,188,777 B2 | 5/2012 | Yamaguchi | |
| 8,198,927 B2 * | 6/2012 | Moore | H03L 7/091 327/156 |
| 8,867,685 B2 | 10/2014 | Maneatis | |
| 10,141,941 B2 | 11/2018 | Petrov | |
| 10,700,688 B1 * | 6/2020 | Fan | H03L 7/087 |

FOREIGN PATENT DOCUMENTS

WO    2022125188 A2    10/2022

* cited by examiner

*Primary Examiner* — Tomi Skibinski
(74) *Attorney, Agent, or Firm* — Fletcher Yoder, P.C.

(57) ABSTRACT

In a charge pump-based PLL circuit, charge pump output current variation may cause phase instability at an output of a VCO. The output current variation may be caused by low-frequency disturbances (e.g., tuning voltage (Vtune) drift with channel length modulation effect), disturbance in a gate bias voltage of a transistor, or a VDD transient. Such a low-frequency disturbance may occur during initial lock, which may affect phase settling time, or after lock, which may result in phase instability. A replica charge pump and a current filtering and compensation circuit may be implemented at the output of a main charge pump to provide error current compensation to suppress channel length modulation effect, improve phase stability, and reduce phase noise.

20 Claims, 9 Drawing Sheets

SYSTEMS AND METHODS FOR IMPROVED CHARGE PUMP PHASE-LOCKED LOOP PHASE STABILITY

BACKGROUND

The present disclosure relates generally to wireless communication, and more specifically to phase stability in a phase-locked loop (PLL).

In a charge pump-based PLL circuit, charge pump output current variation may cause phase instability at an output of a voltage-controlled oscillator (VCO). The output current variation may be caused by low-frequency disturbances (e.g., tuning voltage (Vtune) drift with channel length modulation effect), disturbance in a gate bias voltage of a transistor, or a supply voltage (VDD) transient. Such a low-frequency disturbance may occur during initial lock of a PLL, which may affect phase settling time, or after lock, which may result in phase instability.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, A system, includes a first charge pump; a second charge pump electrically coupled to the first charge pump; and filter circuitry electrically coupled to the first charge pump and the second charge pump, the filter circuitry including an amplifier, a current mirror, and a current injector.

In another embodiment, compensation circuitry includes a first charge pump configured to output a first error current; a second charge pump electrically coupled to the first charge pump and configured to output a second error current corresponding to the first error current; and filtering circuitry configured to receive the first error current and the second error current, filter the first error current based on the second error current, and compensate for the first error current based on the second error current.

In yet another embodiment, phase-locked loop includes a phase-frequency detector (PFD); charge pump circuitry coupled to an output of the PFD, the charge pump circuitry including a first charge pump; a second charge pump electrically coupled to the first charge pump; and filter circuitry electrically coupled to the first charge pump and the second charge pump, the filter circuitry including an amplifier, and a current mirror. The phase-locked loop also includes a loop filter coupled to an output of the charge pump circuitry; and a voltage-controlled oscillator (VCO) coupled to an output of the loop filter and an input of the PFD.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

When introducing elements of various embodiments of the present disclosure, the articles "a," "an," and "the" are intended to mean that there are one or more of the elements. The terms "comprising." "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately." "near." "about." "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

A PLL may include a PFD, a charge pump, a loop filter, a VCO, and a divider. The PFD may receive a fixed reference signal and a feedback signal from the divider and may output a signal based on a phase differential between the reference signal and the feedback signal. The charge pump may be coupled to an output of the PFD and may control voltage supplied from a supply voltage to the loop filter. An output of the loop filter may be coupled to an input of the VCO, and an output of the VCO may be coupled to an input of the divider. The charge pump may output an error current based on a low-frequency disturbance, such as Vtune drift (e.g., a variation of the tuning voltage of the VCO due to age, heat, wear, and so on) at the output of the VCO (e.g., with channel-length modulation effect), a gate bias disturbance, or a supply voltage transient. When the PLL compensates for the error current, the frequency of the input signal may be maintained, but a resulting phase error may occur due to the low-frequency disturbance that may occur during initial lock of the PLL, which may affect phase settling time, or after lock, which may result in phase instability.

A replica charge pump and a current filtering and compensation circuit may be implemented at the output of a main charge pump to provide error current compensation to suppress channel length modulation effect, improve phase stability, and reduce phase noise. The replica charge pump may be sized at 1/N with respect to the main charge pump, and may include a replica p-channel metal-oxide semiconductor field-effect transistor (pMOS) and a replica n-channel MOSFET (nMOS). That is, the replica charge pump is N-times smaller than the main charge pump, where N may be any appropriate number such as 1.5, 2, 4, 8, and so on. A gate terminal of the replica pMOS may be coupled to a gate terminal of a pMOS of the main charge pump, a gate terminal of the replica nMOS may be coupled to a gate terminal of an nMOS of the main charge pump, and a drain terminal of the pMOS may share a power source with a drain terminal of the replica pMOS such that the replica charge pump may output a replica error current that may be the same or approximately the same as the error current of the main charge pump, only scaled at 1/N.

The current filtering and compensation circuitry may include a two-stage operational amplifier (op amp), wherein a first stage of the two-stage op amp may include internal op amp circuitry and a second stage of the two-stage op amp may include a first pMOS and a first nMOS, wherein a source terminal of the first pMOS may be coupled to a drain terminal of the first nMOS. The current filtering and compensation circuitry may include an injector circuit including a second pMOS and a second nMOS, wherein a source terminal of the second pMOS may be coupled to a drain terminal of the second nMOS. The filtering and compensation circuitry may include a current mirror, where a first branch of the current mirror may include the second stage of the two-stage op amp and a second branch of the current mirror may include the current injector. Accordingly, the current injector may mirror the current of the second stage of the two-stage op amp. A first output of the op amp may be coupled to a gate terminal of the first pMOS and a gate terminal of the second pMOS, and a second output of the first stage of the op amp may be coupled to a gate terminal of the first nMOS and a gate terminal of the second nMOS.

The replica charge pump may output the replica error current to a positive terminal of the op amp and an output of the second stage of the two-stage op amp. The main charge pump may output the error current to a negative terminal of the op amp and an output of the injector circuit. The current injector may feed or provide a compensation current to compensate for the error current of the main charge pump based on the replica error current fed or input into the first branch of the current mirror. It may be noted that, as the error current from the main charge pump flows into the injector circuit, the error current may not be flowing into the loop filter of the PLL, which may mitigate or eliminate the error current that flows into the feedback path of the PLL (e.g., the loop filter, the VCO, and the divider), reducing or eliminating the phase instability in the PLL. By outputting the compensation current to the main charge pump and by rerouting the error current into the injector circuit, the filtering and compensation circuitry may reduce or eliminate the error current output from the main charge pump, thereby reducing or eliminating phase instability in the PLL.

Figure 1:
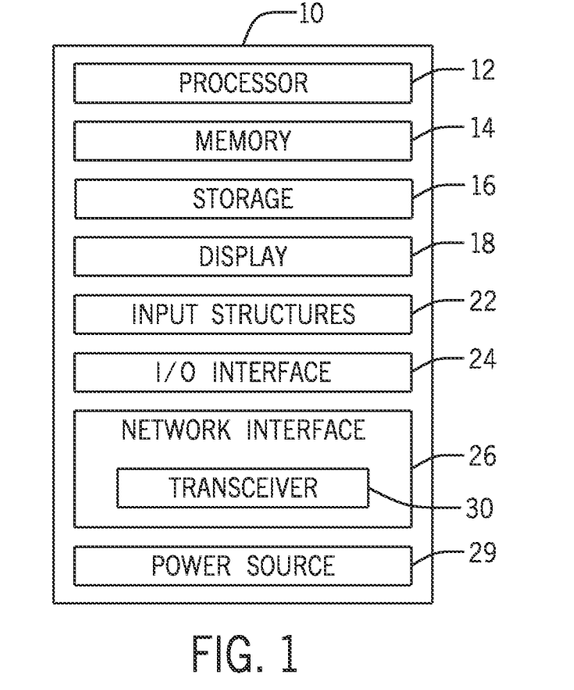
FIG. 1 is a block diagram of an electronic device, according to embodiments of the present disclosure.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a 3rd generation (3G) cellular network, universal mobile telecommunication system (UMTS), 4th generation (4G) cellular network, Long Term Evolution® (LTE) cellular network, Long Term Evolution License Assisted Access (LTE-LAA) cellular network, 5th generation (5G) cellular network, and/or New Radio (NR) cellular network, a 6th generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
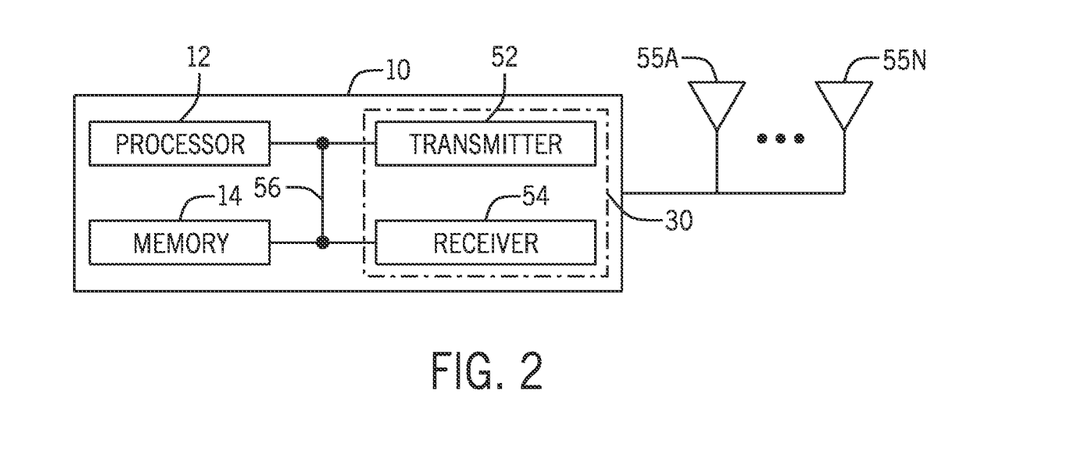
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with one or more beams and various configurations. In some embodiments, multiple antennas of the antennas 55A-55N of an antenna group or module may be communicatively coupled to a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
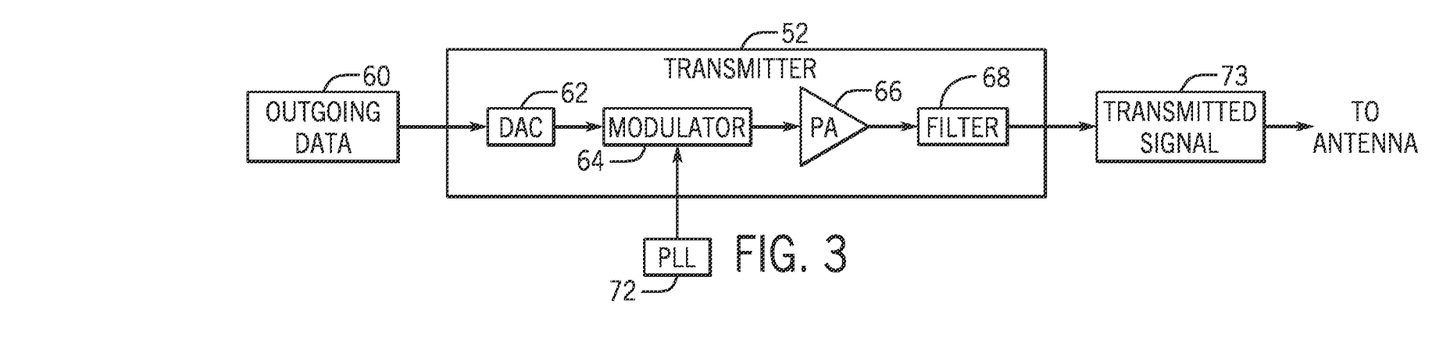
FIG. 3 is a schematic diagram of a transmitter of the electronic device of FIG. 1, according to embodiments of the present disclosure.

FIG. 3 is a schematic diagram of the transmitter 52 (e.g., transmit circuitry), according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 64 may combine the converted analog signal with a carrier signal to generate a radio wave. A power amplifier (PA) 66 receives the modulated signal from the modulator 64. The power amplifier 66 may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted signal 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter.

The power amplifier 66 and/or the filter 68 may be referred to as part of a radio frequency front end (RFFE), and more specifically, a transmit front end (TXFE) of the electronic device 10. A phase-locked loop (PLL) 72 may be coupled to the transceiver 30 and may generate a high frequency clock signal to upconvert or downconvert a signal between baseband and the antennas 55. For instance, the PLL 72 may be coupled between the transmitter 52 and the antennas 55 or may be coupled to the transmitter (e.g., coupled to the modulator 64) to upconvert the signal from baseband to the antennas 55. Additionally, the transmitter 52 may include any suitable additional components not shown, or may not include certain of the illustrated components, such that the transmitter 52 may transmit the outgoing data 60 via the one or more antennas 55. For example, the transmitter 52 may include a mixer and/or other digital up converter besides the PLL 72. As another example, the transmitter 52 may not include the filter 68 if the power amplifier 66 outputs the amplified signal in or approximately in a desired frequency range (such that filtering of the amplified signal may be unnecessary).

Figure 4:
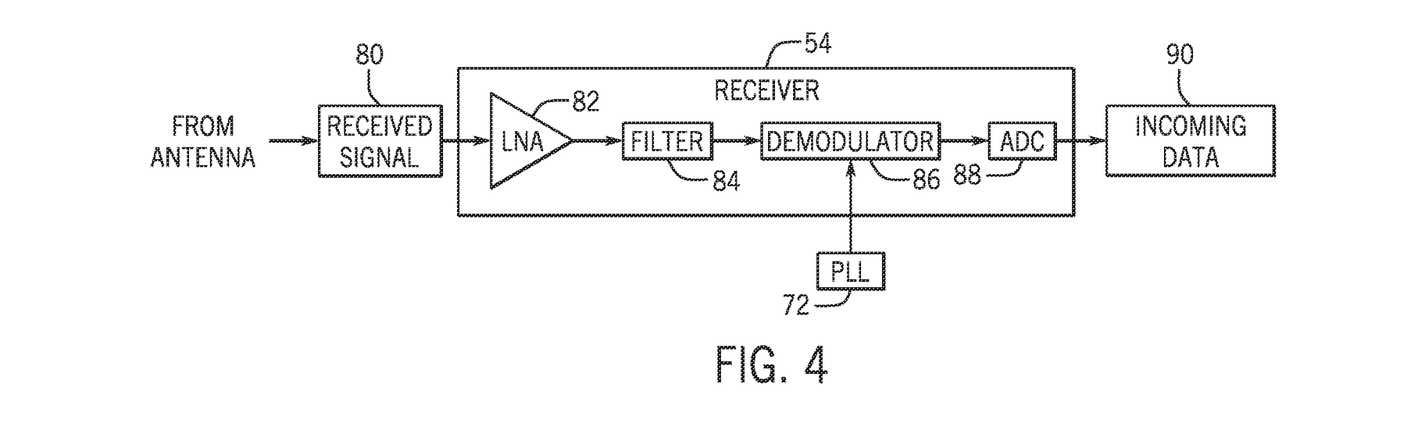
FIG. 4 is a schematic diagram of a receiver of the electronic device of FIG. 1, according to embodiments of the present disclosure.

FIG. 4 is a schematic diagram of the receiver 54 (e.g., receive circuitry), according to embodiments of the present disclosure. As illustrated, the receiver 54 may receive received signal 80 from the one or more antennas 55 in the form of an analog signal. The PLL 72 may be coupled to the input of the receiver 54 or may be coupled to the receiver 54 (e.g., to the demodulator 86 of the receiver 54) to downconvert the signal from the antennas 55 to baseband. A low noise amplifier (LNA) 82 may amplify the received analog signal to a suitable level for the receiver 54 to process. A filter 84 (e.g., filter circuitry and/or software) may remove undesired noise from the received signal 80, such as cross-channel interference. The filter 84 may also remove additional signals received by the one or more antennas 55 that are at frequencies other than the desired signal. The filter 84 may include any suitable filter or filters to remove the undesired noise or signals from the received signal, such as a bandpass filter, a bandstop filter, a low pass filter, a high pass filter, and/or a decimation filter. The low noise amplifier 82 and/or the filter 84 may be referred to as part of the RFFE, and more specifically, a receiver front end (RXFE) of the electronic device 10.

A demodulator 86 may remove a radio frequency carrier signal and/or extract a demodulated signal (e.g., an envelope signal) from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received signal 80 via the one or more antennas 55. For example, the receiver 54 may include a mixer and/or a digital down converter.

Figure 5:
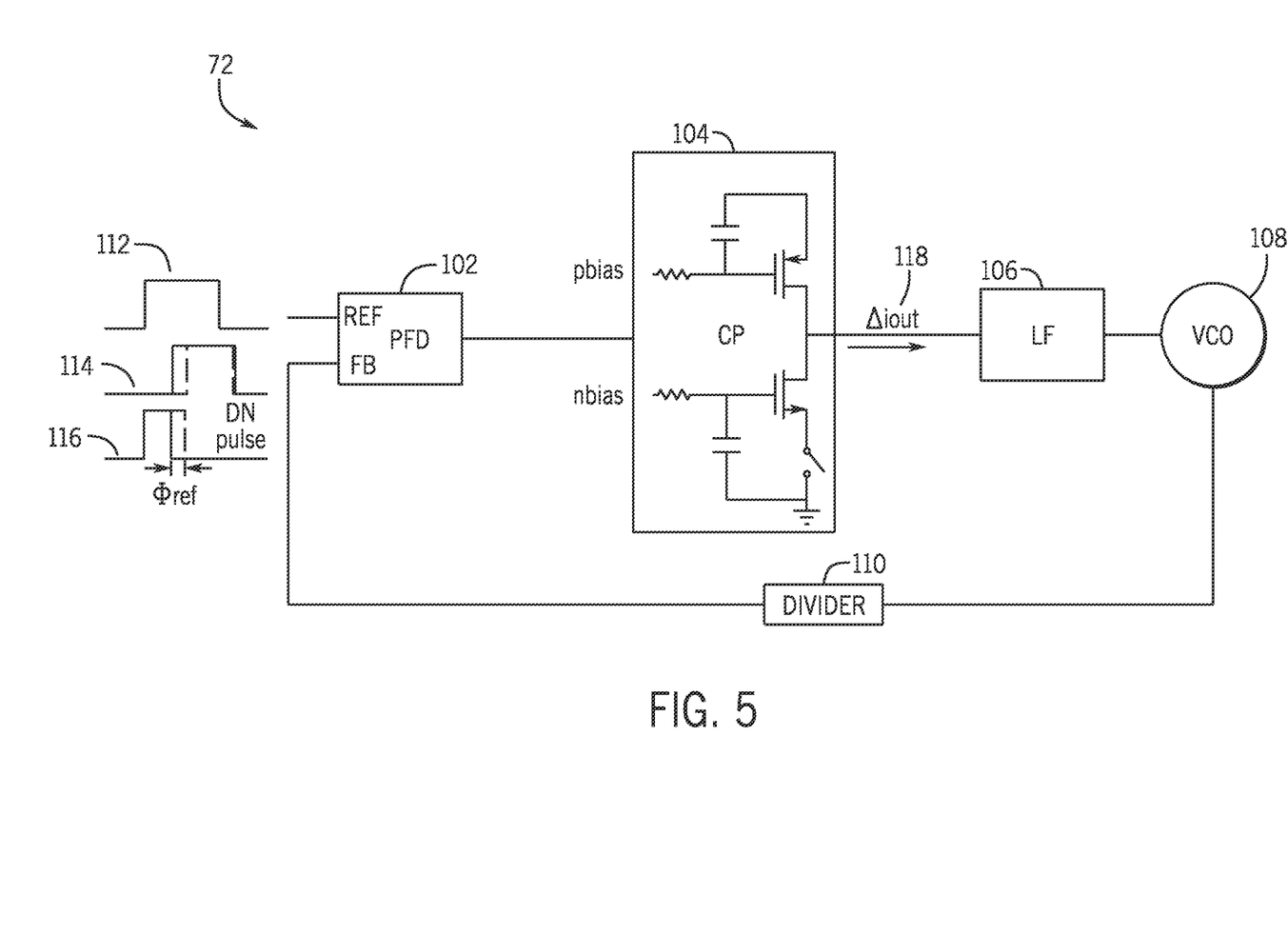
FIG. 5 is a block diagram of a PLL.

FIG. 5 is a block diagram of the PLL 72. The PLL 72 includes a phase-frequency detector (PFD) 102, a charge pump 104, a loop filter 106 (e.g., a bandpass filter, a bandstop filter, a low pass filter, a high pass filter, a decimation filter, and so on), a voltage-controlled oscillator 108, and a divider 110. The PFD 102 receives as input a reference signal 112 (e.g., from a clock signal generator) and a feedback signal 114 (e.g., from the divider 110). The PFD 102 detects a phase difference between a phase of the reference signal 112 and the feedback signal 114 and outputs an output signal 116 based on the phase difference between the reference signal 112 and the feedback signal 114. The PFD 102 provides the output signal 116 to the charge pump 104. A pulse width of the charge pump 104 determines the amount of current provided to the loop filter 106. The loop filter 106 provides a filtered signal to the VCO 108, which adjusts the oscillation frequency of the filtered signal based on a VCO control signal. The divider 110 (e.g., dividing circuitry) may divide out the signal output from the VCO 108, and the divider 110 provides the feedback signal 114 to the PFD 102.

Low-frequency disturbances (e.g., tuning voltage (Vtune) drift with channel length modulation effect, disturbance in a gate bias voltage of a transistor, or a VDD transient) may cause the charge pump 104 to output an error current 118 (e.g., a leakage current). The error current may occur during initial lock of the PLL 72 (e.g., the PLL 72 first locks onto a desired phase), affecting phase settling time, or after lock of the PLL 72, resulting in phase instability in the PLL 72. In some cases, the charge pump 104 may be designed with a servo loop to suppress the effect of a channel-length modulation. In such a charge pump, channel length modulation effect may be suppressed by including an op amp in between one or more current mirrors and enclosing the servo loop around the one or more current mirrors. However, in a servo loop-based charge pump, the additional op amp may cause excessive noise, and thus a low-pass filter with a low pole may be added to filter out the additional op amp noise. Loading the op amp output and the charge pump output with the low-pass filter to suppress the op amp noise may increase difficult of maintaining loop stability. To suppress channel-length modulation effect in the PLL 72 while maintaining low noise and loop stability, the disclosed embodiments may include a replica charge pump and filter circuitry that may replicate the error current 118 and compensate for the error current 118 based on the replicated error current.

Figure 6:
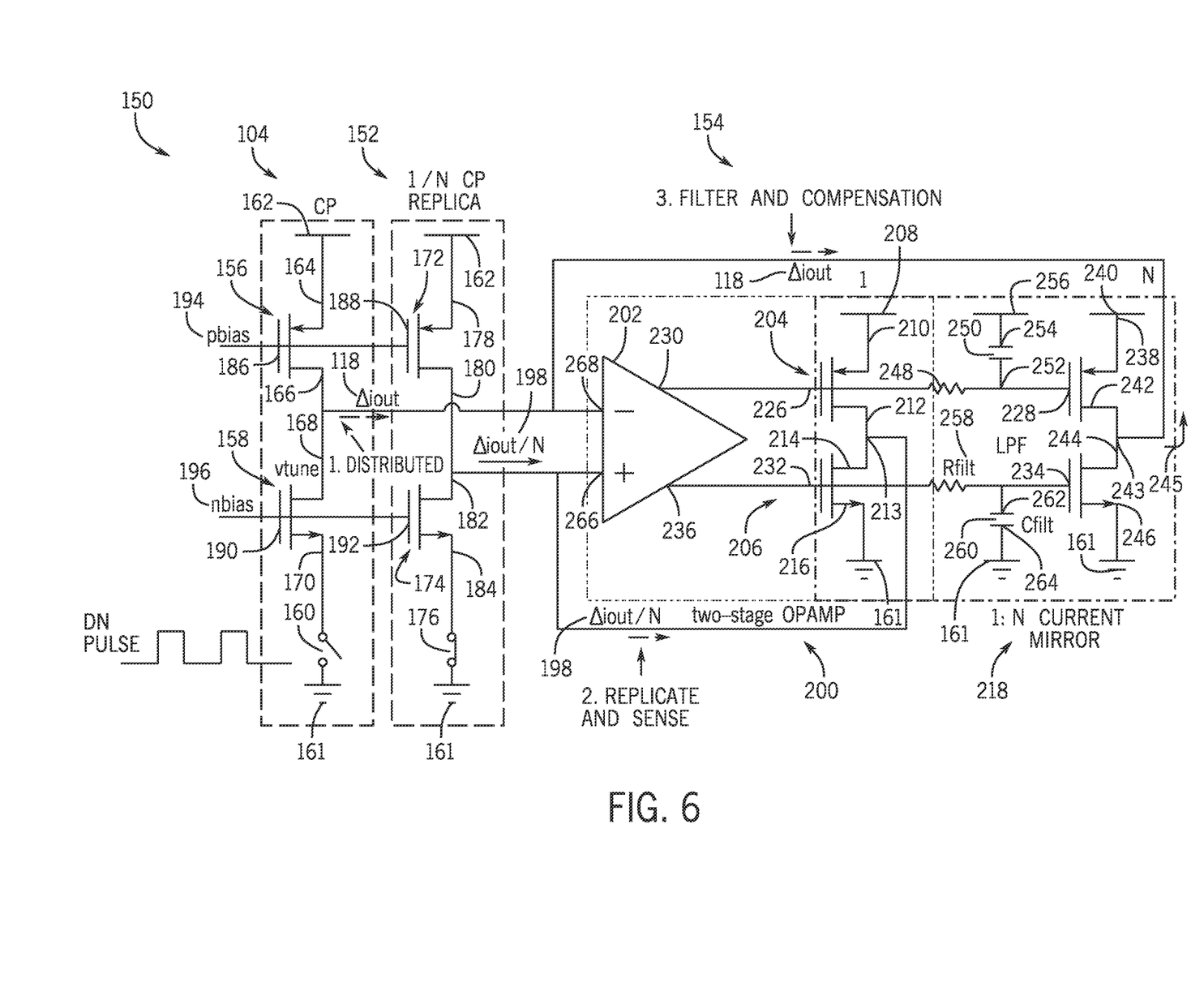
FIG. 6 is a schematic diagram of compensation circuitry for performing replica charge pump-based current compensation, according to embodiments of the present disclosure.

FIG. 6 is a schematic diagram of compensation circuitry 150 for performing replica charge pump-based current compensation, according to an embodiment of the present disclosure. The compensation circuitry 150 includes a charge pump 104, a replica charge pump 152, and filter circuitry 154 configured to perform current compensation based at least partly on the error current 118 output from the charge pump 104 and a replica error current output from the replica charge pump 152. The charge pump 104 includes pMOS 156 and nMOS 158, and a switch 160 coupled to ground 161 and configured to open and close to control the current through the charge pump 104. A voltage source 162 is coupled to a drain terminal 164 of the pMOS 156, and a source terminal 166 is coupled to a drain terminal 168 of the nMOS 158. A source terminal 170 of the nMOS 158 is coupled to the switch 160.

The replica charge pump 152 is coupled to the charge pump 104 and the filter circuitry 154 and includes a pMOS 172, an nMOS 174, and a switch 176 coupled to the ground 161 and configured to open and close to control the current through the replica charge pump 152. The pMOS 172 is coupled to the voltage source 162 at a drain terminal 178. A source terminal 180 of the pMOS 172 is coupled to a drain terminal 182 of the nMOS 174. A source terminal 184 of the nMOS 174 is coupled to the switch 176. A gate terminal 186 of the pMOS 156 and a gate terminal 188 of the pMOS 172 are coupled together, and a gate terminal 190 of the nMOS 158 and a gate terminal 192 of the nMOS 174 are coupled together.

The replica charge pump 152 may be sized at 1/N the size of the charge pump 104. The charge pump 104 and the replica charge pump 152 may share the voltage source 162, gate bias voltages (e.g., a positive bias voltage (pbias) 194 and a negative bias voltage (nbias) 196) and the ground 161, such that the output current (e.g., error current 118) of the charge pump 104 is the same or approximately the same as the output current (e.g., replica error current 198) of the replica charge pump 152 except that the replica error current 198 is scaled by 1/N (e.g., is 1/N times the size of the error current 118). While the charge pump 104 and the replica charge pump 152 are shown as sharing the voltage source 162, the replica charge pump 152 may, in some embodiments, include a replica voltage reference generator to generate a replica voltage reference signal of a voltage reference signal of the charge pump 104.

The filter circuitry 154 includes a two-stage op amp 200 that includes the op amp 202 as the first stage and a pMOS 204 and an nMOS 206 as the second stage. The pMOS 204 may be coupled to a voltage source 208 at a drain terminal 210 and a source terminal 212 of the pMOS 204 may be coupled to a drain terminal 214 of the nMOS 206 to form an output 213 of the second stage of the two-stage op amp 200. A source terminal 216 of the nMOS 206 may be coupled to ground 161. The filter circuitry 154 may also include a 1:N current mirror 218 that includes the pMOS 204 and the nMOS 206 and a pMOS 220 and an nMOS 222. The 1:N current mirror 218 may scale the current by a factor of N for compensation. The pMOS 220 and the nMOS 222 may together include a current injector 224. A gate terminal 226 of the pMOS 204 may be coupled to a gate terminal 228 of the pMOS 220 and coupled to an output 230 of the op amp 202. A gate terminal 232 of the nMOS 206 is coupled to a gate terminal 234 of the nMOS 222 and coupled to an output 236 of the op amp 202. A drain terminal 238 of the pMOS 220 may be coupled to a voltage source 240, and a source terminal 242 of the pMOS 220 may be coupled to a drain terminal 244 of the nMOS 222 to form an output 243 of the current injector 224. A source terminal 246 of the nMOS 222 is coupled to ground 161.

A resistor 248 is coupled to the gate terminals 226 and 228, and a capacitor 250 is coupled at a node 252 between the resistor 248 and the gate terminal 228 and coupled at a node 254 to a voltage source 256. Similarly, a resistor 258 is coupled to the gate terminals 232 and 234, and a capacitor 260 is coupled at a node 262 between the resistor 258 and the gate terminal 234 and at a node 264 to ground 161. The output 213 is coupled to a positive input terminal 266 of the op amp 202, and the output 243 is coupled to a negative input terminal 268 of the op amp 202.

Figure 7:
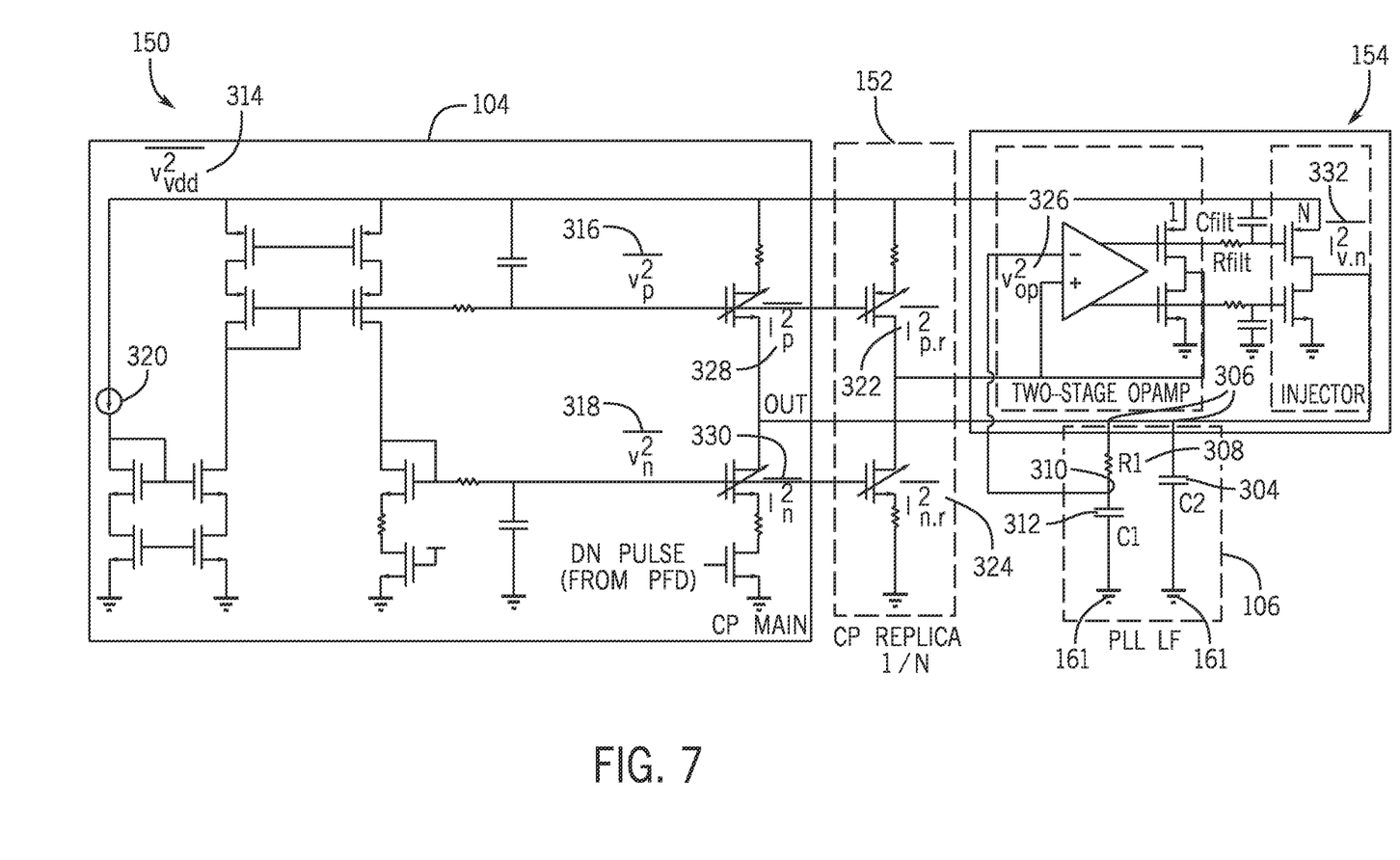
FIG. 7 is a circuit diagram of the compensation circuitry of FIG. 6, according to embodiments of the present disclosure.

The charge pump 104 outputs the error current 118 to the negative input terminal 268 of the op amp 202 and to the output 243. The replica charge pump 152 outputs the replica error current 198 to the positive input terminal 266 of the op amp 202 and to the output 213. The op amp 202 may have a large input impedance at the positive input terminal 266 and the negative input terminal 268, such that the input to the op amp 202 is nearly an open circuit. Consequently, the error current 118 may feed (e.g., be input) into the output 243 and the replica error current 198 may feed (e.g., be input) into the output 213. As the pMOS 204, the pMOS 220, the nMOS 206, and the nMOS 222 constitute the 1:N current mirror 218, the current at the output 243 includes a compensation current 245 that may be the same or approximately the same as the current at the output 213, except that the compensation current 245 at the output 243 may be scaled to N-times larger than the current at the output 213. The compensation current 245 at the output 243 may be fed or input back into the output of the charge pump 104, mitigating the error current 118 at the charge pump 104. Additionally, as the error current 118 may flow into the output 243, the error current 118 may not flow into the loop filter 106, thus reducing or eliminating the phase error and the phase instability of the PLL 72. In this manner, the compensation circuitry 150 may reduce or eliminate the phase error output by the charge pump 104, thereby reducing or eliminating phase instability in the PLL 72. FIG. 7 is a circuit diagram of compensation circuitry 150, where the compensation circuitry 150 includes a detailed schematic diagram of the compensation circuitry 150 discussed with respect to FIG. 6, according to an embodiment of the present disclosure. The compensation circuitry 150 includes the charge pump 104, the replica charge pump 152, and the filter circuitry 154 as discussed with respect to FIG. 6. Additionally, the compensation circuitry 150 includes a loop filter 106 coupled to the output of the charge pump 104 and the output 143. The loop filter 106 includes a low-pass filter including a capacitor 304 coupled at a node 306 to the output 143 and the output of the charge pump 104 and coupled to ground 161. The loop filter 106 includes a resistor 308 coupled at the node 306 to the output 143 and the output of the charge pump 104 and coupled at a node 310 to a capacitor 312. The capacitor 312 is coupled to ground 161. In some embodiments, the negative input terminal 268 of the op amp 202 may be coupled between the resistor 308 and the capacitor 312 at the node 310. In other embodiments, the negative input terminal 268 of the op amp 202 may be coupled to the node 306.

Noise transfer functions 314, 316, and 318 represent noise resulting from a power supply (e.g., 162) and the charge pump 104 at the gate of current source 320. The noise transfer functions 314, 316, and 318 may benefit from noise cancellation resulting from higher pole of the resistor capacitor circuit (RC pole) frequency from the resistors 248 and 258 and the capacitors 250 and 260. Noise transfer functions 322, 324, and 326 represent noise resulting from the replica charge pump 152 and the two-stage op amp 200. Such noise associated with the noise transfer functions 322, 324, and 326 may not be cancelled, but may benefit from (e.g., be decreased by) a lower RC pole from the resistors 248 and 258 and the capacitors 250 and 260. The noise transfer functions 328, 330, and 332 represent noise resulting from the charge pump leakage current (e.g., the error current 118 discussed with respect to FIGS. 5 and 6) and the current injector 224. The noise transfer functions 328, 330, and 330 may be independent of the RC poles.

Figure 8:
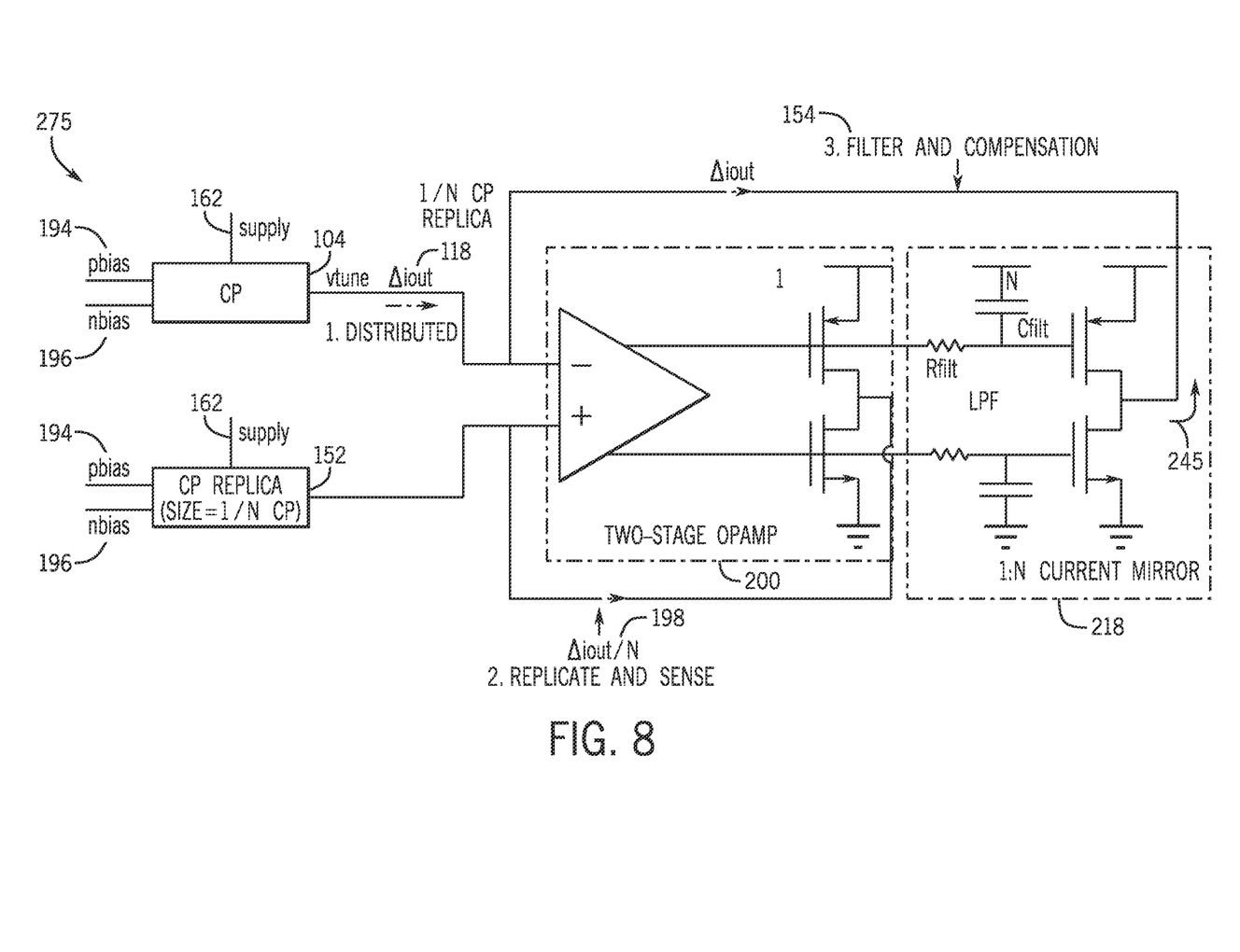
FIG. 8 is a circuit diagram of the compensation circuitry of FIG. 6, according to embodiments of the present disclosure.

While FIG. 6 and FIG. 7 illustrates one implementation of the compensation circuitry 150, there may be other implementations. FIG. 8 is a circuit diagram illustrating compensation circuitry 175, wherein the compensation circuitry 175 includes an alternative implementation of the compensation circuitry 150, according to embodiments of the present disclosure. As may be observed in FIG. 8, the compensation circuitry 175 includes the charge pump 104 and the replica charge pump 152, but the charge pump 104 and the replica charge pump 152 are not physically coupled to each other (e.g., gate terminals of the charge pump 104 and the replica charge pump 152 are not directly coupled together. The charge pump 104 and the replica charge pump 152 receive voltage from the voltage source 162, the pbias 194 and the nbias 196, and the charge pump 104 and the replica charge pump 152 are coupled to the filter circuitry 154. The filter circuitry 154 produces the compensation current 245 and supplies the compensation current 245 to the charge pump 104. In this manner, the compensation circuitry 175 operates similarly or identically to the compensation circuitry 150 of FIGS. 6 and 7.

Figure 9:
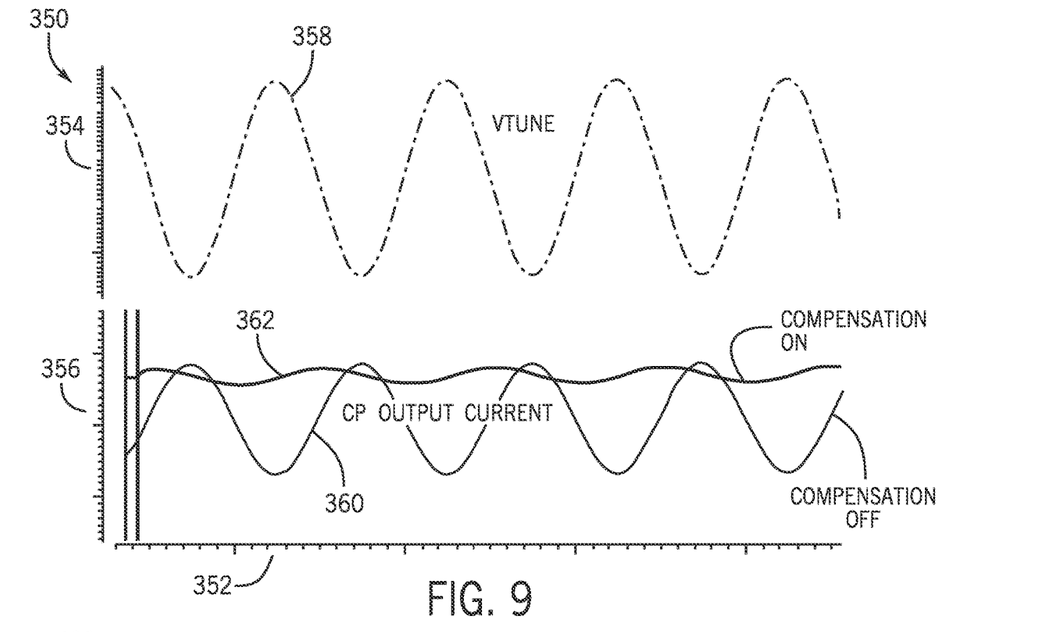
FIG. 9 is a graph illustrating magnitude of an error current due to tuning voltage (Vtune) drift with compensation (e.g., performed by the compensation circuitry of FIG. 6) and without compensation, according to embodiments of the present disclosure.

FIG. 9 is a graph or plot 350 illustrating magnitude of the error current 118 due to Vtune drift with compensation (e.g., performed by the compensation circuitry 150) and without compensation, according to an embodiment of the present disclosure. The graph 350 includes an x-axis 352 representing time (in milliseconds (ms)), a y-axis 354 representing voltage (in millivolts (mV)) and another y-axis 356 representing current (in microamps (μA)). A curve 358 illustrates a Vtune signal of the VCO 108. A curve 360 illustrates the error current 118 due to Vtune drift without the compensation circuitry 150 performing replica charge pump-based compensation. As previously discussed. Vtune drift may generate the error current 118, which may cause phase instability in the PLL 72. A curve 362 illustrates the error current 118 due to Vtune drift with the compensation circuitry 150 providing replica charge pump-based compensation. As may be appreciated, the curve 362 displays a notably smaller or reduced error current than represented by the curve 360. Accordingly, it may be appreciated that the compensation circuitry 150 may reduce or eliminate the error current 118, thereby reducing or eliminating phase instability in the PLL 72.

Figure 10:
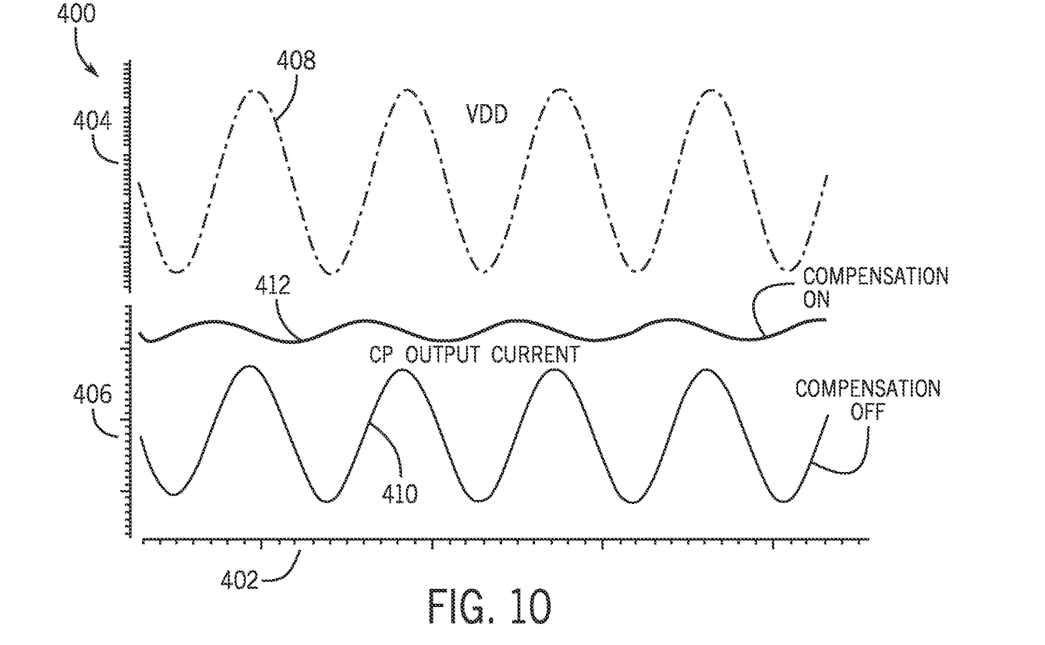
FIG. 10 is a graph illustrating magnitude of the error current due to supply voltage (e.g., VDD) transient with compensation (e.g., performed by the compensation circuitry of FIG. 6) and without compensation, according to embodiments of the present disclosure.

FIG. 10 is a graph or plot 400 illustrating magnitude of the error current 118 due to supply voltage (e.g., VDD) transient with compensation (e.g., performed by the compensation circuitry 150) and without compensation, according to an embodiment of the present disclosure. The graph 400 includes an x-axis 402 representing time (ms), a y-axis 404 representing voltage (V) and another y-axis 406 representing current (μA). A curve 408 illustrates an input voltage signal of the voltage supply. A curve 410 illustrates the error current 118 due to a supply transient without the compensation circuitry 150 performing replica charge pump-based compensation. As previously discussed, a supply transient may generate the error current 118, which may cause phase instability in the PLL 72. A curve 412 illustrates the error current 118 due to the supply transient with the compensation circuitry 150 providing replica charge pump-based compensation. As may be appreciated, the curve 412 displays a notably smaller or reduced error current than represented by the curve 410. Accordingly, it may be appreciated that the compensation circuitry 150 may reduce or eliminate the error current 118, thereby reducing or eliminating phase instability in the PLL 72.

Figure 11:
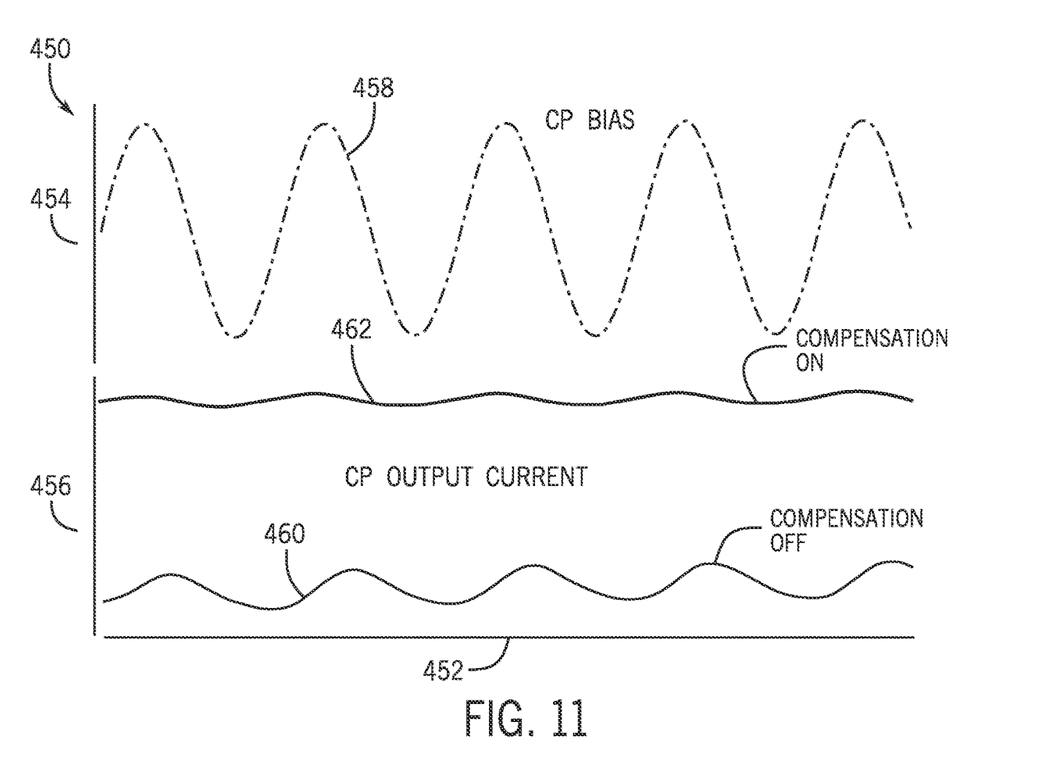
FIG. 11 is a graph illustrating magnitude of the error current due to a charge pump current ripple with compensation (e.g., performed by the compensation circuitry of FIG. 6) and without compensation, according to embodiments of the present disclosure.

FIG. 11 is a graph or plot 450 illustrating magnitude of the error current 118 due to a charge pump current ripple with compensation (e.g., performed by the compensation circuitry 150) and without compensation, according to an embodiment of the present disclosure. The graph 450 includes an x-axis 452 representing time (ms), a y-axis 454 representing current (A) and another y-axis 456 representing current (μA). A curve 458 illustrates a bias current signal (e.g., associated with a transistor gate of the charge pump 104). A curve 460 illustrates the error current 118 due to the bias current ripple without the compensation circuitry 150 performing replica charge pump-based compensation. As previously discussed, a bias current ripple may generate the error current 118, which may cause phase instability in the PLL 72. A curve 462 illustrates the error current 118 due to the bias current ripple with the compensation circuitry 150 providing replica charge pump-based compensation. As may be appreciated, the curve 462 displays a notably smaller or reduced error current than represented by the curve 460. Accordingly, it may be appreciated that the compensation circuitry 150 may reduce or eliminate the error current 118, thereby reducing or eliminating phase instability in the PLL 72.

Figure 12:
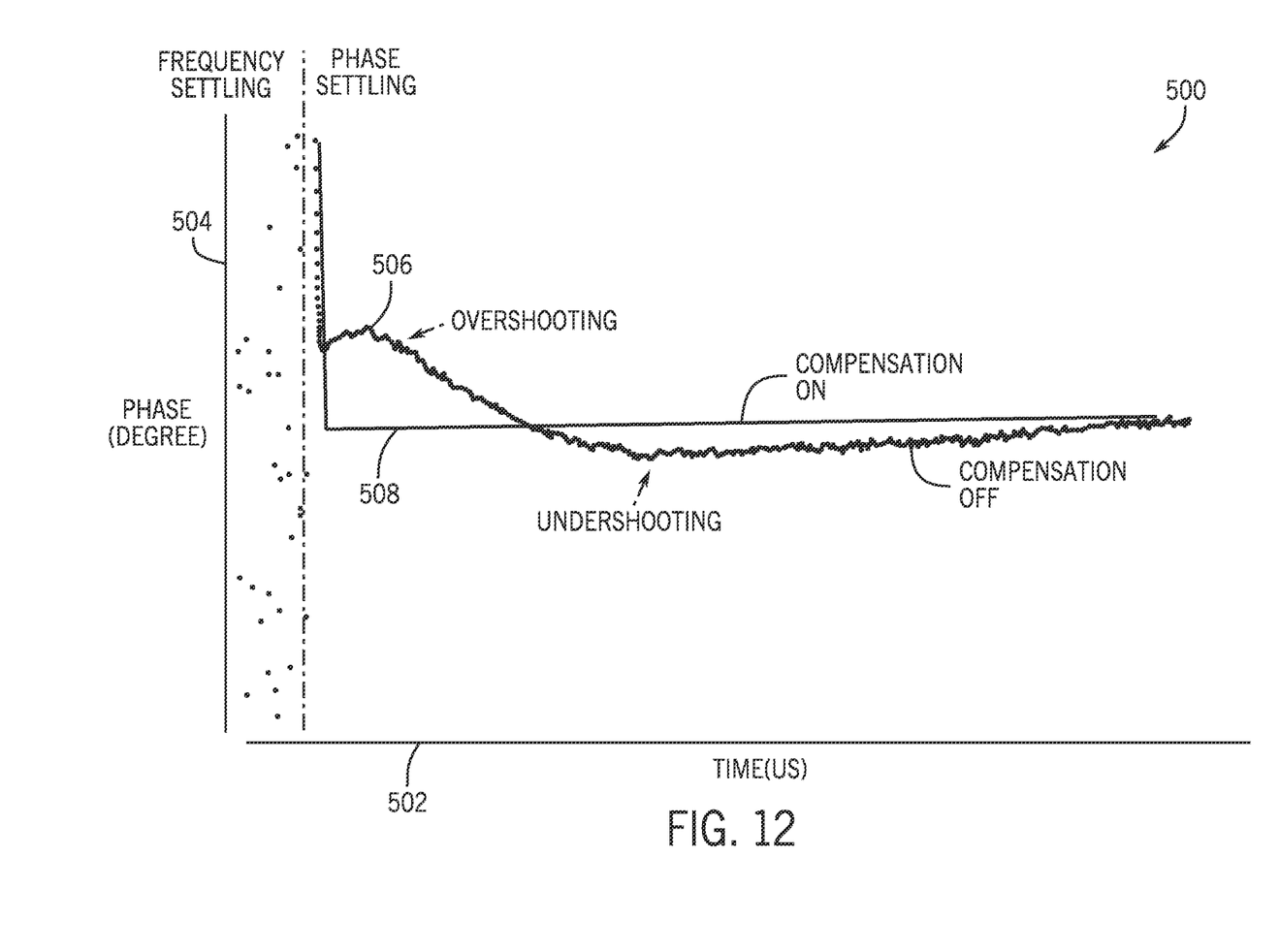
FIG. 12 is a graph illustrating PLL phase settling before and after a compensation is performed by the compensation circuitry of FIG. 6, according to embodiments of the present disclosure.

FIG. 12 is a graph or plot 500 illustrating phase settling before and after a compensation is applied by the compensation circuitry 150, according to an embodiment of the present disclosure. The graph 500 includes an x-axis 502 representing time (μs) and a y-axis 504 representing phase (degrees). A curve 506 shows the phase of the PLL 72 prior to compensation via the compensation circuitry 150, and a curve 508 shows the phase of the PLL 72 after the compensation via the compensation circuitry 150. As may be observed, the phase settling of the curve 508 is more stable than the curve 506, which overshoots a desired phase initially and then undershoots the desired phase before settling near the desired phase. Accordingly, it may be appreciated that the compensation circuitry 150 may improve phase settling time of the PLL 72.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112 (f). However, for any claims containing elements designated in any other manner, it is intended that such elements are not to be interpreted under 35 U.S.C. 112 (f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A system, comprising:
   a first charge pump;

a second charge pump electrically coupled to the first charge pump; and filter circuitry electrically coupled to the first charge pump and the second charge pump, the filter circuitry comprising
an amplifier,
a current mirror, and
a current injector.

2. The system of claim 1, wherein a first branch of the current mirror comprises a first p-channel metal oxide semiconductor field-effect transistor (pMOS) and a first n-channel MOSFET (nMOS), a source terminal of the first pMOS being coupled to a first voltage source, a drain terminal of the first pMOS being coupled to a drain terminal of the first nMOS, and a source terminal of the first nMOS being coupled to ground.

3. The system of claim 2, wherein a second branch of the current mirror comprises a second pMOS and a second nMOS, wherein a source terminal of the second pMOS is coupled to a second voltage source, a drain terminal of the second pMOS is coupled to a drain terminal of the second nMOS, and a source terminal of the second nMOS is coupled to the ground.

4. The system of claim 3, wherein the current injector comprises the second branch of the current mirror.

5. The system of claim 3, wherein a gate terminal of the first pMOS is coupled to a gate terminal of the second pMOS, and a gate terminal of the first nMOS is coupled to a gate terminal of the second nMOS.

6. The system of claim 5, wherein the gate terminal of the first pMOS and the gate terminal of the second pMOS is coupled to a first output of the amplifier, and wherein the gate terminal of the first nMOS and the gate terminal of the second nMOS is coupled to a second output of the amplifier.

7. The system of claim 6, wherein an output of the first charge pump is coupled to a first input terminal of the amplifier and the second output of the current mirror.

8. The system of claim 6, wherein an output of the second charge pump is coupled to a second input terminal of the amplifier and the first output of the current mirror.

9. The system of claim 1, wherein the first charge pump comprises a first p-channel metal oxide semiconductor field-effect transistor (pMOS) and a first n-channel MOSFET (nMOS), wherein a source terminal of the first pMOS is coupled to a voltage source, a drain terminal of the first pMOS is coupled to a drain terminal of the first nMOS, and the source terminal of the first nMOS is coupled to a first switch configured to couple to ground.

10. The system of claim 9, wherein the second charge pump comprises a second pMOS and a second nMOS, wherein a source terminal of the second pMOS is coupled to the voltage source, a drain terminal of the first pMOS is coupled to a drain terminal of the second nMOS, and the source terminal of the second nMOS is coupled to a second switch configured to couple to ground.

11. The system of claim 10, wherein a gate terminal of the first pMOS is coupled to a gate terminal of the second pMOS and a gate terminal of the first nMOS is coupled to a gate terminal of the second nMOS.

12. The system of claim 1, comprising a replica reference voltage generator configured to generate a replica reference voltage signal of a reference voltage signal of the first charge pump.

13. Compensation circuitry comprising:
a first charge pump configured to output a first error current;
a second charge pump electrically coupled to the first charge pump and configured to output a second error current corresponding to the first error current; and
filtering circuitry configured to receive the first error current and the second error current, filter the first error current based on the second error current, and compensate for the first error current based on the second error current.

14. The compensation circuitry of claim 13, wherein the filtering circuitry comprises a two-stage operational amplifier and a current mirror.

15. The compensation circuitry of claim 14, wherein a first branch of the current mirror comprises a stage of the two-stage operational amplifier and a second branch of the current mirror comprises a current injector.

16. The compensation circuitry of claim 15, wherein the current injector is configured to provide a compensation current to the first charge pump based on a current received at the stage of the two-stage operational amplifier.

17. A phase-locked loop, comprising:
a phase-frequency detector (PFD);
charge pump circuitry coupled to an output of the PFD, the charge pump circuitry comprising
a first charge pump;
a second charge pump electrically coupled to the first charge pump; and
filter circuitry electrically coupled to the first charge pump and the second charge pump, the filter circuitry comprising
an amplifier, and
a current mirror,
a loop filter coupled to an output of the charge pump circuitry; and
a voltage-controlled oscillator (VCO) coupled to an output of the loop filter and an input of the PFD.

18. The phase-locked loop of claim 17, wherein the amplifier is configured to receive a first error current from the first charge pump and a second error current from the second charge pump.

19. The phase-locked loop of claim 18, wherein the amplifier is configured to output the first error current to a first transistor and a second transistor of the current mirror and configured to output the second error current to a third transistor and a fourth transistor of the current mirror.

20. The phase-locked loop of claim 19, wherein an input of the second transistor and the fourth transistor is configured to receive the second error current and an output of the first transistor and the third transistor is configured to output a compensation current to the first charge pump based on the second error current received at the second transistor and the fourth transistor.

* * * * *